United States Patent
Park et al.

(10) Patent No.: US 10,056,283 B2
(45) Date of Patent: Aug. 21, 2018

(54) APPARATUS OF ALIGNING SUBSTRATE AND METHOD OF ALIGNING SUBSTRATE

(71) Applicant: Samsung Display Co., Ltd., Yongin-si, Gyeonggi-do (KR)

(72) Inventors: Jin Wan Park, Asan-si (KR); Ji Hwan Park, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 171 days.

(21) Appl. No.: 14/935,207

(22) Filed: Nov. 6, 2015

(65) Prior Publication Data

US 2016/0356597 A1    Dec. 8, 2016

(30) Foreign Application Priority Data

Jun. 2, 2015   (KR) .................. 10-2015-0078012

(51) Int. Cl.
| | |
|---|---|
| *G01B 11/00* | (2006.01) |
| *H01L 21/68* | (2006.01) |
| *H01L 21/67* | (2006.01) |
| *H01L 21/66* | (2006.01) |
| *H01L 21/687* | (2006.01) |

(52) U.S. Cl.
CPC ........ *H01L 21/68* (2013.01); *H01L 21/67259* (2013.01); *H01L 21/68728* (2013.01); *H01L 21/68771* (2013.01); *H01L 22/12* (2013.01)

(58) Field of Classification Search
CPC . H01L 21/67706; B65H 5/14; B65H 2405/57; G01N 21/958; G01N 21/8914; B65G 49/067; B65G 49/066
USPC ............... 356/399–401, 237.2–237.6, 239.1
See application file for complete search history.

(56) References Cited

U.S. PATENT DOCUMENTS

| | | | | | |
|---|---|---|---|---|---|
| 3,284,974 | A | * | 11/1966 | Stein .......................... | E04B 2/74 52/239 |
| 5,822,038 | A | * | 10/1998 | Slater ..................... | G03B 35/24 355/22 |
| 6,126,335 | A | * | 10/2000 | Yamamoto ......... | H04N 1/00795 226/120 |
| 2004/0201843 | A1 | * | 10/2004 | Glenn ............... | H01L 21/67265 356/244 |

(Continued)

FOREIGN PATENT DOCUMENTS

| | | |
|---|---|---|
| KR | 10-2008-0035142 A | 4/2008 |
| KR | 10-2008-0055176 A | 6/2008 |

(Continued)

*Primary Examiner* — Tarifur Chowdhury
*Assistant Examiner* — Isiaka Akanbi
(74) *Attorney, Agent, or Firm* — Knobbe Martens Olson & Bear LLP

(57) ABSTRACT

An apparatus and a method for aligning a substrate are disclosed. In one aspect, the substrate aligning apparatus includes a stage configured to support a plurality of substrates, a supporting pin placed in the stage to support the substrates and an alignment clamp configured to respectively move each of the substrates to align the substrates. The alignment clamp can respectively align at least two of the substrates with reference to an alignment reference position as a two-dimensional coordinate system which includes a first axis and a second axis crossing the first axis and is set on an imaginary plane by the first and second axes.

22 Claims, 7 Drawing Sheets

(56) References Cited

U.S. PATENT DOCUMENTS

| | | | | |
|---|---|---|---|---|
| 2007/0281444 A1* | 12/2007 | Nishio | ................... | B27B 5/063 |
| | | | | 438/462 |
| 2008/0233272 A1* | 9/2008 | Ibe | ....................... | C23C 14/042 |
| | | | | 427/66 |
| 2011/0141448 A1* | 6/2011 | Aoki | ................... | B65G 49/064 |
| | | | | 355/72 |
| 2014/0185038 A1* | 7/2014 | Lin | ..................... | G01B 21/045 |
| | | | | 356/138 |

FOREIGN PATENT DOCUMENTS

| KR | 10-0914446 B1 | 8/2009 |
|---|---|---|
| KR | 10-1174860 B1 | 8/2012 |

\* cited by examiner

APPARATUS OF ALIGNING SUBSTRATE AND METHOD OF ALIGNING SUBSTRATE

RELATED APPLICATIONS

This application claims priority to and the benefit of Korean Patent Application No. 10-2015-0078012 filed in the Korean Intellectual Property Office on Jun. 2, 2015, the entire contents of which are incorporated herein by reference.

BACKGROUND

Field

The described technology generally relates to an apparatus for aligning a substrate along with a method for aligning a substrate.

Description of the Related Technology

A substrate is a plate configured to form a thin film such as an electric circuit wiring on a surface, and substrates of various shapes, sizes, and materials have been researched and developed along with the electronics industry.

For example, when the substrate is used in the electronics industry, the substrate is used as a semiconductor IC substrate in which a memory element of the semiconductor industry is mounted, or as various bases of a touch panel display device displaying an image, such as a liquid crystal display (LCD), a field emission display (FED), a plasma display panel (PDP), and an organic light emitting diode display.

General methods of forming the thin film on the substrate include a physical vapor deposition (PVD) such as a vacuum evaporation method, an ion plating method, and a sputtering method, or a chemical vapor deposition (CVD) by a gas reaction.

Among them, a chemical vapor deposition apparatus forming a thin film on the substrate of the organic light emitting diode display by using the chemical vapor deposition method includes a stage generally installed inside a deposition chamber and fixing the substrate.

However, since it is difficult to align the substrate by only a visual alignment due to maintaining the inside of the deposition chamber of the chemical vapor deposition apparatus in a high vacuum, a chemical reaction is provided together with an apparatus for aligning the substrate.

In the conventional apparatus for aligning the substrate, only one substrate is placed inside to be aligned, and recently, due to large display devices, one substrate of a mother glass is divided into several sections of substrates and the aligning work and the chemical vapor deposition are performed for each substrate.

However, in the case of the conventional apparatus for aligning the substrate, to perform the alignment and the deposition, since one substrate standardized to be suitable to the apparatus for aligning the substrate must be placed, if the alignment work of each substrate is performed for every divide substrate, a maximum process time (a tact time) is necessarily increased such that production efficiency is decreased.

The above information disclosed in this Background section is only to enhance the understanding of the background of the invention, and therefore it may contain information that does not form the prior art that is already known in this country to a person of ordinary skill in the art.

SUMMARY OF CERTAIN INVENTIVE ASPECTS

One inventive aspect relates to an apparatus for aligning a substrate used in various industries requiring a substrate, including the electronics industry and chemical industry, along with a method for aligning a substrate.

Another aspect is an apparatus for aligning a substrate, simultaneously or concurrently placing and aligning two or more substrates, and a method for aligning a substrate.

Another aspect is a substrate aligning apparatus including a stage mounted with two or more substrates; a supporting pin installed in the stage to support the two or more mounted substrates; and an alignment clamp unit moving the two or more supported substrates to two or more substrates, respectively, wherein the alignment clamp unit respectively aligns two or more substrates with reference to an alignment reference position as a two-dimensional coordinate system set on an imaginary plane by a first axis and a second axis crossing the first axis and made of the first axis and the second axis.

The stage may be placed so that an upper surface is parallel to the imaginary plane.

The supporting pin may respectively support a lower portion of the two or more mounted substrates.

The two or more supporting pins may be installed to rise and fall toward the substrate with reference to the stage, respectively.

The alignment clamp unit may be installed to be movable to the stage in order to clamp and fix one portion of the mounted substrate, and a moving trajectory of the substrate by the alignment clamp unit may be parallel to the imaginary plane.

The alignment clamp unit may include a first clamping unit axially aligning the clamped substrate with reference to the first axis and a second clamping unit axially aligning the clamped substrate with reference to the second axis.

Another aspect is a method for aligning a substrate including mounting two or more substrates on a stage; aligning the two or more substrates; and testing the alignment of the two or more substrates, wherein in the substrate alignment step, two or more substrates are aligned with reference to an alignment reference position as a two-dimensional coordinate system set on an imaginary plane by a first axis and a second axis crossing the first axis and made of the first axis and the second axis.

In the stage mounting step, after the substrate is mounted on the supporting pin installed in the stage, the supporting pin and the substrate may descend toward the upper surface of the stage.

The substrate alignment step may include a first axis alignment step axially aligning the clamped substrate with reference to the first axis and a second axis alignment step axially aligning the clamped substrate with reference to the second axis.

The first axis alignment step and the second axis alignment step may be simultaneously performed.

In the substrate alignment step, a moving trajectory of the substrate may be parallel to the imaginary plane.

In the alignment test step, a fine alignment may be performed for the substrate to be parallel to the imaginary plane.

In the alignment test step, a step of detecting an alignment mark formed in the substrate may be performed.

Another aspect is a substrate aligning apparatus comprising: a stage configured to support a plurality of substrates; a supporting pin placed in the stage to support the substrates; and an alignment clamp configured to respectively move each of the substrates to align the substrates, wherein the alignment clamp is further configured to respectively align at least two of the substrates with reference to an alignment reference position as a two-dimensional coordinate system which includes a first axis and a second axis crossing the first axis and is set on an imaginary plane by the first and second axes.

In the above substrate aligning apparatus, the stage is placed so that an upper surface is substantially parallel to the imaginary plane. In the above substrate aligning apparatus, the supporting pin is configured to respectively support a lower portion of the substrates. In the above substrate aligning apparatus, the supporting pin comprises a plurality of supporting pins that are respectively configured to rise and fall toward the substrates with reference to the stage. In the above substrate aligning apparatus, the alignment clamp is configured to move on the stage to clamp and fix a portion of at least one of the substrates, and wherein a moving trajectory of the substrate by the alignment clamp is substantially parallel to the imaginary plane. In the above substrate aligning apparatus, the alignment clamp includes a first clamp configured to axially align the clamped substrate with reference to the first axis; and a second clamp configured to axially align the clamped substrate with reference to the second axis.

Another aspect is a method for aligning a substrate comprising: mounting a plurality of substrates on a stage; aligning the substrates with reference to an alignment reference position as a two-dimensional coordinate system which includes a first axis and a second axis crossing the first axis and is set on an imaginary plane by the first and second axes; and testing the alignment of the substrates. The above method further comprises, after at least one of the substrates is mounted on a supporting pin installed on the stage, lowering the supporting pin and the substrate toward the upper surface of the stage. The above method further comprises clamping and fix a portion of at least one of the substrates.

In the above method, the aligning includes first axially aligning the clamped substrate with reference to the first axis; and second axially aligning the clamped substrate with reference to the second axis. In the above method, the first axially aligning and the second axially aligning are simultaneously or concurrently performed. In the above method, a moving trajectory of the clamped substrate is substantially parallel to the imaginary plane. In the above method, the aligning comprises performing a fine alignment for the clamped substrate to be substantially parallel to the imaginary plane. In the above method, the aligning comprises detecting an alignment mark formed in the clamped substrate.

Another aspect is a substrate aligning apparatus comprising: a stage configured to support a plurality of substrates; and an alignment clamp configured to respectively move each of the substrates to align the substrates, wherein the alignment clamp is configured to respectively align at least two of the substrates with reference to an alignment reference position as a two-dimensional coordinate system which includes a first axis and a second axis crossing the first axis and is set on an imaginary plane by the first and second axes.

The above substrate aligning apparatus further comprises a supporting pin placed in the stage to support the substrates. In the above substrate aligning apparatus, the supporting pin is configured to respectively support a lower portion of the substrates. In the above substrate aligning apparatus, the supporting pin comprises a plurality of supporting pins that are respectively configured to rise and fall toward the substrates with reference to the stage. In the above substrate aligning apparatus, the alignment clamp is configured to move on the stage to clamp and fix a portion of at least one of the substrates. In the above substrate aligning apparatus, the alignment clamp includes a first clamp configured to axially align the clamped substrate with reference to the first axis; and a second clamp configured to axially align the clamped substrate with reference to the second axis.

According to at least one of the disclosed embodiments, two or more substrates may be simultaneously or concurrently placed and aligned, and thus compatibility may be improved regardless of the size or number of substrates and productivity may be improved due to the reduction of the tact time.

DETAILED DESCRIPTION OF CERTAIN INVENTIVE EMBODIMENTS

Figure 1:
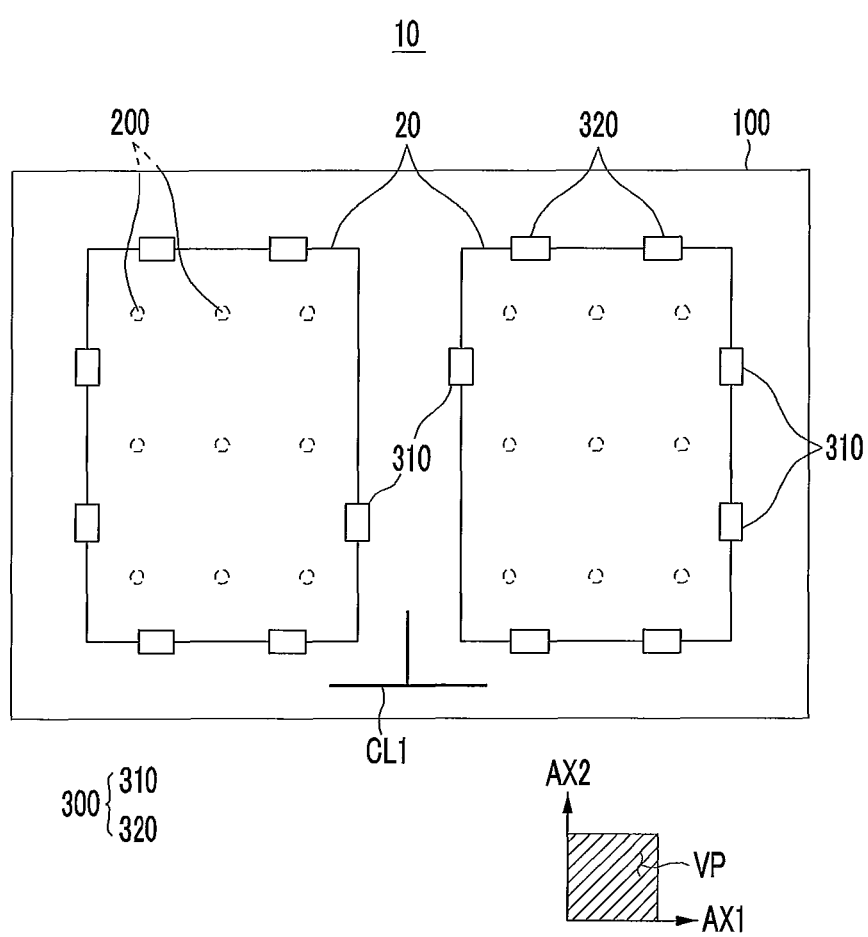
FIG. 1 is a view of an apparatus for aligning a substrate according to an exemplary embodiment.

Hereinafter, the exemplary embodiment will be described more fully with reference to the accompanying drawings, in which exemplary embodiments of the described technologies are shown. As those skilled in the art would realize, the described embodiments may be modified in various different ways, all without departing from the spirit or scope of the described technology.

Further, in the exemplary embodiments, since like reference numerals designate like elements having the same configuration, a first exemplary embodiment is representatively described, and in other exemplary embodiments, only configurations different from the first exemplary embodiment will be described.

Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In this disclosure, the term "substantially" includes the meanings of completely, almost completely or to any significant degree under some applications and in accordance with those skilled in the art. The term "connected" can include an electrical connection.

Now, a configuration of an apparatus for aligning a substrate according to an exemplary embodiment will be described with reference to FIG. 1 and FIG. 2.

FIG. 1 is a view showing an apparatus 10 for aligning a substrate according to an exemplary embodiment.

The substrate aligning apparatus 10 is described as a configuration installed inside a deposition apparatus to deposit a thin film on a surface in a manufacturing apparatus of a display device for convenience. However, the described technology is not limited thereto and it may be installed and used in a process requiring substrate alignment in other industries in which a substrate is required, such as other electronics industries or the chemical industry.

According to an exemplary embodiment, an alignment reference position CL1 may be set on an imaginary plane VP including a first axis AX1 and a second axis AX2 crossing the first axis AX1. The alignment reference position CL1 as an imaginary reference position made of the first axis AX1 and the second axis AX2, as shown in FIG. 1, may be set as a two-dimensional Cartesian coordinate system made of the first and second axes AX1 and AX2 and may be positioned on the imaginary plane VP.

The alignment reference position CL1 may be flexibly set according to a standard or a disposal location of a substrate 20 that will be described later. For example, the alignment reference position CL1 detects size and number data of the substrate 20 placed on the substrate aligning apparatus 10 through a detection unit or detector (not shown) and transmits it to a calculating unit or calculator (not shown).

The calculating unit (not shown) calculates the standard and number data of the substrate 20 to calculate the data of the alignment reference position CL1 positioned inside an area corresponding to a viewing area in an upper surface of the substrate aligning apparatus 10 of FIG. 1 among the imaginary plane VP.

The calculating unit (not shown) transmits the data of the alignment reference position CL1 of a display unit (not shown), and the display unit (not shown) may directly display and set the alignment reference position CL1 to the substrate aligning apparatus 10 through a method of projecting a light source of a shape of a two-dimensional coordinate system corresponding to the alignment reference position CL1 to the substrate aligning apparatus 10.

However, the described technology is not limited thereto, and the configuration of the display unit (not shown) may be omitted to not physically display the alignment reference position CL1 and the data of the alignment reference position CL1 calculated by the calculating unit (not shown) may be transmitted to an alignment controller (not shown) to predetermine and store the alignment reference position CL1 by the alignment controller (not shown) The alignment controller (not shown) may control an alignment clamp unit that will be described later depending on the alignment reference position CL1 to perform the alignment of the substrate 20.

In an exemplary embodiment, the alignment reference position CL1 is set at the lower side among a space separated between two substrates 20, as shown for convenience in FIG. 1; however, it is not limited to the position shown in FIG. 1 and a center or an upper side may be set among the separated space between two substrates 20.

As described above, the substrate aligning apparatus 10 may respectively perform the alignment work of two or more substrates 20 placed with reference to the alignment reference position CL1.

In an exemplary embodiment, as shown in FIG. 1, two substrates 20 placed by the substrate aligning apparatus 10 may be simultaneously or concurrently aligned with reference to the alignment reference position CL1. Accordingly, whether the substrate of the mother glass standard or two or more divided substrates, compared to the conventional substrate aligning apparatus (not necessarily prior art) displaying and aligning only one substrate, two or more substrates 20 may be placed and simultaneously or concurrently two or more substrates 20 may be aligned such that productivity may be improved based on the reduction of the maximum process time (the tact time).

The substrate aligning apparatus 10 can simultaneously or concurrently place and align two or more substrates 20. In this embodiment, the substrate aligning apparatus 10 includes a stage 100, a supporting pin 200, and an alignment clamp unit or alignment clamp 300.

The stage 100 is a table supporting the substrate 20 in the alignment and may be a configuration such as a surface plate or a chuck generally used for a measuring apparatus.

Two or more substrates 20 may be simultaneously or concurrently placed on the stage 100. The area of the upper surface of the stage 100 may be formed to be larger than the sum area of two or more substrates 20 to simultaneously or concurrently place two or more substrates 20. The upper surface of the stage 100 may be placed to be substantially parallel to the imaginary plane VP.

In FIG. 1, two substrates 20 are placed on the stage 100, however the described technology is not limited thereto For example, one substrate of the mother glass size is placed, while all the divided substrates into which the substrate of the mother glass is divided are placed on the stage 100. Also, the alignment reference position may be changed depending on the size and the number of the substrates placed on the stage 100.

The supporting pin 200 is installed to protrude toward the upper surface of the stage 100, thereby supporting the lower surface of the substrate 20 placed on the stage 100. Also, by installing the supporting pin 200 to rise and fall in a vertical direction according to the upper surface of the stage 100, the substrate 20 supported by the supporting pin 200 may rise and fall in the vertical direction with reference to the upper surface of the stage 100. That is, the supporting pin 200 may guide the movement of the substrate 20 such that the substrate 20 may be mounted on the upper surface of the stage 100 in the vertical direction with reference to the upper surface of the stage 100.

Two or more supporting pins 200 may be respectively installed on the upper surface of the stage 100 to uniformly support the lower surface of the substrate 20, and two or more supporting pins 200 may be driven to rise and fall. Accordingly, the substrate 20 may be controlled to maintain the position substantially parallel to the upper surface of the stage 100 by two or more supporting pins 200.

Since an error may be minutely generated at the position of the lower surface of the substrate 20 and the upper surface of the stage 100 due to two or more supporting pins 200 rising or falling, the exemplary embodiment can fix the lower surface of the substrate 20 to the upper surface of the stage 100 by lowering the supporting pin 200 through a vacuum absorption.

The alignment clamp unit 300 is installed in the stage 100 to be moved, thereby clamping the sides of the two or more substrates 20 mounted to the stage 100 due to the lowering of the supporting pin 200. The alignment clamp unit 300 may be forward or backward in the direction of the first axis AX1 or the second axis AX2 to align the two or more clamped substrates 20 with reference to the alignment reference position CL1.

Also, the alignment clamp unit 300 may substantially vertically tilt the clamped substrate 20 with respect to the direction of the imaginary plane VL as a rotation center axis.

A moving trajectory in which two or more substrates 20 are moved or tilted in the direction of the first axis AX1 or the second axis AX2 by the alignment clamp unit 300 is substantially parallel to the imaginary plane VL.

As described above, two or more substrates 20 may be respectively performed with an axis alignment for the first axis AX1 and the second axis AX2 with reference to the alignment reference position CL1 corresponding to a two-axis coordinate system through the alignment clamp unit 300.

The alignment clamp unit 300 includes a first clamping unit 310 and a second clamping unit 320.

Two or more first clamping units 310 may axially align the substrates 20 with reference to the first axis AX1 for both edges of the substrate 20 extending substantially in the vertical direction with reference to FIG. 1 to be substantially parallel to the first axis AX1 by moving the clamped substrates 20 forward and backward in the first axis AX1 direction while clamping and fixing both sides of two or more substrates 20 extending substantially in the vertical direction with reference to FIG. 1.

When simultaneously placing two substrates 20 on the stage 100, while two different first clamping units 310 may be placed to be separated between two substrates 20 with reference to FIG. 1, each first clamping unit 310 may be placed to respectively clamp different substrates 20.

Two or more second clamping units 320 may axially align the substrates 20 with reference to the second axis AX2 for both edges of the substrate 20 extended in the horizontal direction with reference to FIG. 1 to be parallel to the second axis AX2 by moving the clamped substrates 20 forward and backward in the second axis AX2 direction while clamping and fixing both sides of two or more substrates 20 extending in the horizontal direction with reference to FIG. 1.

However, the arrangement relation of the first and second clamping units 310 and 320 may be changed depending on the standard or the number of the substrates 20 placed on the stage 100.

One first clamping unit 310 and one second clamping unit 320 may be driven so as to move independently with different sizes and directions from each other, such that the clamping and alignment may be simultaneously or concurrently performed even though two or more substrates 20 are placed on the stage 100.

Accordingly, the substrate aligning apparatus 10 has improved productivity due to the reduction of the tact time compared to the conventional substrate aligning apparatus (not necessarily prior at) placing and aligning only one substrate to be suitable to the particular specification.

Figure 2:
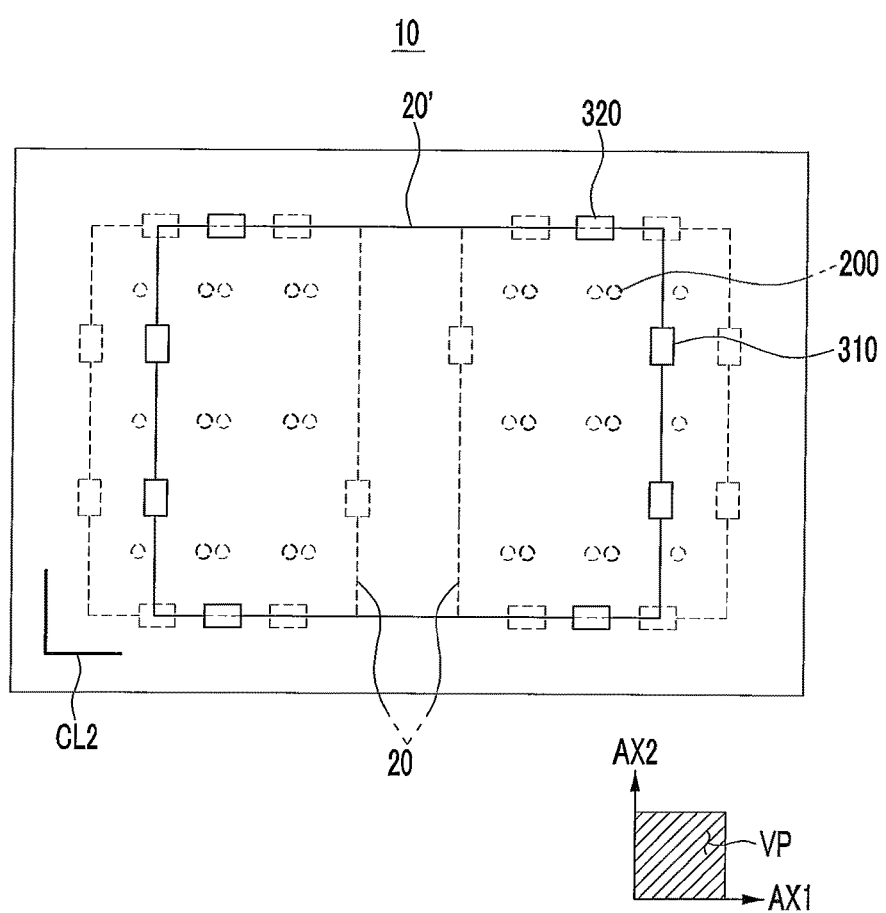
FIG. 2 is a view of an apparatus for aligning a substrate according to an exemplary variation of the exemplary embodiment.

FIG. 2 is a view showing an apparatus for aligning a substrate according to an exemplary variation of the exemplary embodiment. In FIG. 2, to compare the arrangement with the substrate 20', the supporting pin 200, the first and second clamping units 310 and 320 according to the exemplary variation, the position of two substrates, the supporting pin, and the first and second alignment clamps shown in FIG. 1 are represented by dotted lines.

Referring to FIG. 2, one substrate 20' of the mother glass size may be placed only on the stage 100. The substrate 20' of the mother glass size may have substantially the same size as the sum area of two substrates 20 of FIG. 1. In this case, two or more of the first clamping unit 310 to fix both sides of the substrate 20' extending substantially in the vertical direction of the reference substrate of FIG. 2 and two or more of the second clamping unit 320 to fix both sides of the substrate 20' extending substantially in the horizontal direction of the reference substrate of FIG. 2 may be installed.

Since one substrate 20' of the mother glass size is only placed on the stage 100, two first clamping units 310 positioned at the center of the stage 100 of FIG. 1 may be omitted or may be placed not to overlap the substrate 20'.

Also, since one substrate 20' is the arrangement and alignment object, the alignment reference position CL2 may be predetermined differently from the alignment reference position CL1 of FIG. 1 to be suitable to the substrate 20' of the mother glass.

The substrate aligning apparatus 10 can be configured to be compatible with the substrate 20' of the mother glass size by differently controlling the arrangement relation of the supporting pin 200 and the first and second clamping units 310, as shown in FIG. 2, while simultaneously or concurrently placing and, aligning two or more substrates 20 shown in FIG. 1, thereby simultaneously or concurrently placing and aligning a number of substrates having various sizes. That is, the substrate aligning apparatus 10 with improved compatibility regardless of the size and the quantity is provided.

Next, a method for aligning a substrate according to an exemplary embodiment will be described with reference to FIG. 3 to FIG. 7. Hereinafter, the method for aligning the substrate uses the apparatus for aligning the substrate of FIG. 1 such that the detailed configuration of the apparatus for aligning the substrate described above is omitted.

Figure 3:
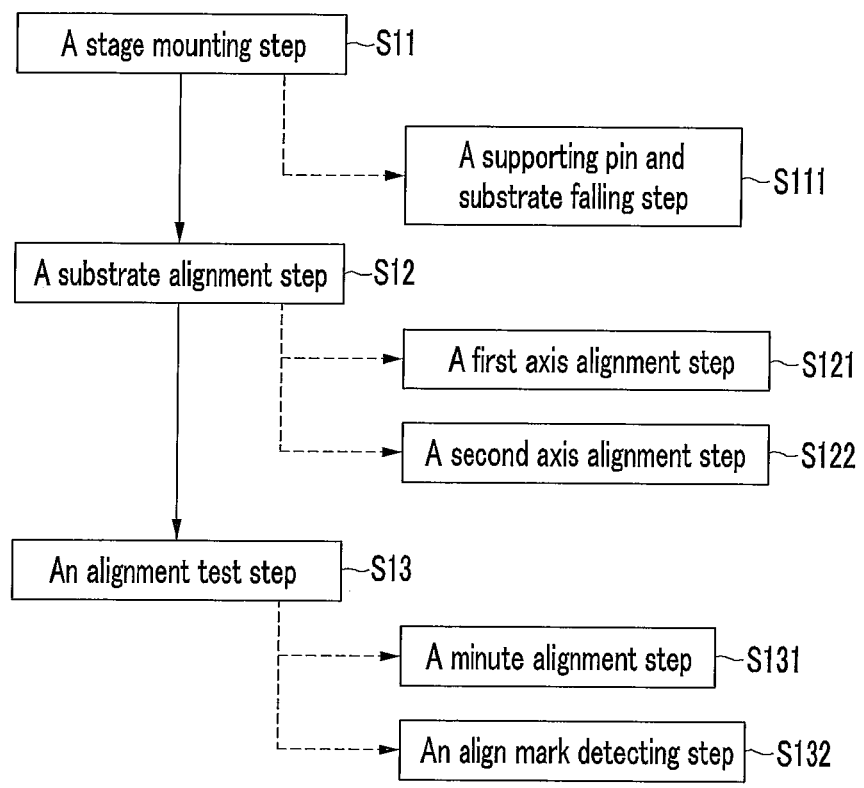
FIG. 3 is a flowchart of a method for aligning a substrate according to an exemplary embodiment.

FIG. 3 is a flowchart of a method for aligning a substrate according to an exemplary embodiment.

The method for aligning the substrate includes a step of mounting at least one substrate on a stage (S11), a step of aligning the mounted substrate with reference to an alignment reference position (S12), and a step of testing the alignment of the aligned substrate (S13).

Figure 4:
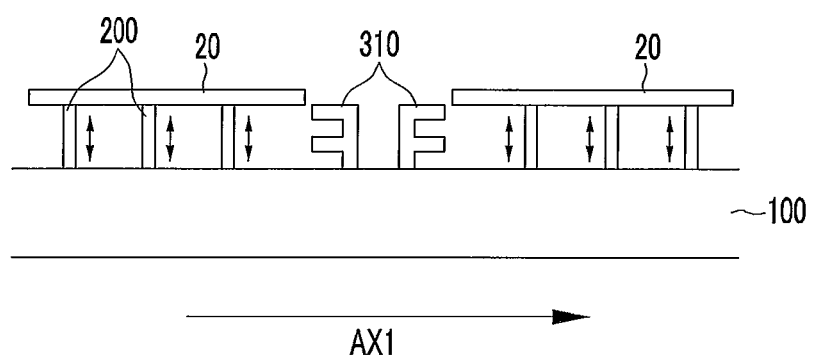
FIG. 4 is a view showing a lowering step of a supporting pin and a substrate of a method for aligning a substrate according to an exemplary embodiment.

FIG. 4 is a view showing a lowering step of a supporting pin and a substrate of a method for aligning a substrate according to an exemplary embodiment, while schematically illustrating a lateral view of the substrate aligning apparatus 10.

In the stage mounting step (S11), as shown in FIG. 4, two or more substrates 20 are mounted on two or more supporting pins 200 on the substrate aligning apparatus 10. As two or more supporting pins 200 rise or fall in an arrow direction of FIG. 4, the mounted substrate 20 may be guided toward the upper surface of the stage 100. That is, in the stage mounting step (S11), a step (S111) together lowering the supporting pin 200 and the substrate 20 by the upward and downward movement of the supporting pin 200 is performed.

In this case, since the alignment clamp is separated from the substrate 20 such that the movement is stopped, the lowering of the supporting pin 200 and the substrate 20 are inferred in the mounting step of the upper surface of the stage 100 of the substrate 20.

If the substrate 20 is mounted on the upper surface of the stage 100, the substrate 20 is absorbed and fixed to the stage 100 through the absorption means (not shown), thereby the fine error may be prevented from being generated by the step between the substrate 20 and the stage 100.

On the other hand, in the stage mounting step (S11), a step predetermining the alignment reference position CL1 coincidental to the mounted substrate 20 may be performed through a method of calculating the data of the size and the number of the substrates 20 mounted to the stage 100 to calculate the data of the alignment reference position CL1, directly projecting the light source of the shape of the two-dimensional coordinate system corresponding to the alignment reference position CL1 to the substrate aligning apparatus 10 based on the data of the calculated alignment reference position CL1, or predetermining and storing the alignment reference position CL1 in the alignment controller based on the data of the alignment reference position CL1.

However, the step of predetermining alignment reference position CL1 can be always performed in the stage mounting step (S11), and may be performed directly before performing the first or second axis alignment step among the substrate alignment steps that will be described later.

Figure 5:
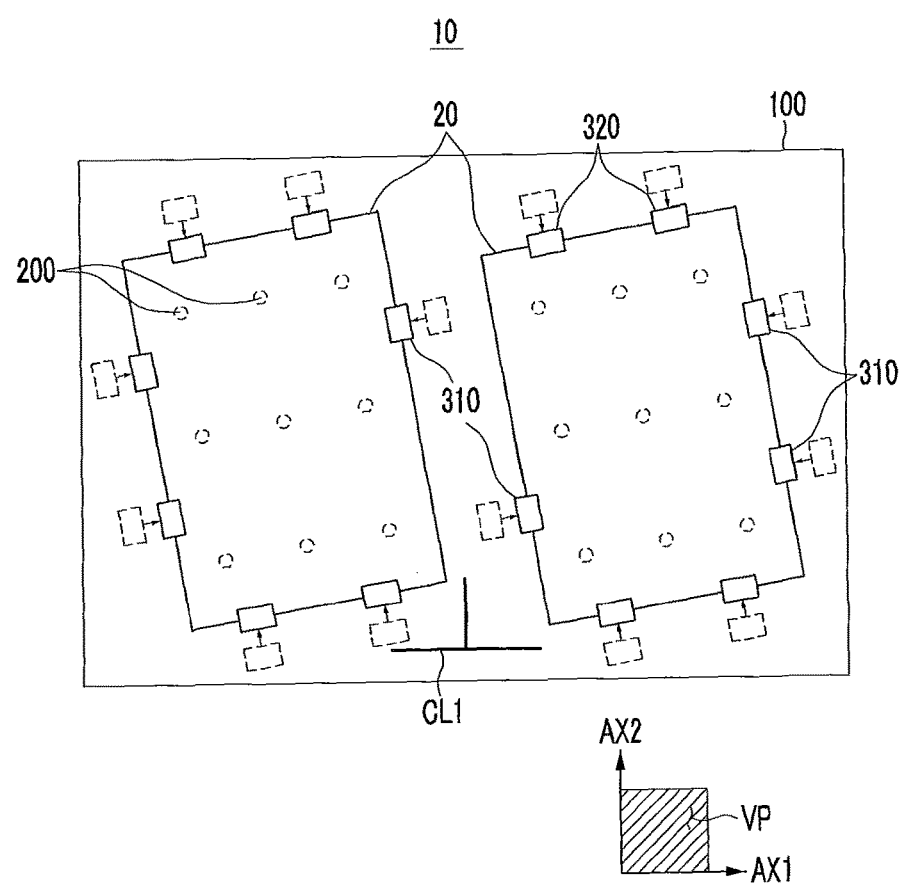
FIG. 5 is a view showing clamping of a substrate by an alignment clamp unit in a substrate aligning step of a method for aligning a substrate according to an exemplary embodiment.

FIG. 5 is a view showing clamping of a substrate by an alignment clamp unit in a substrate aligning step of a method for aligning a substrate according to an exemplary embodiment.

In the substrate alignment step (S12), as shown in FIG. 5, as first and second clamping units 310 and 320 are respectively moved toward the substrate 20 absorbed on the stage, and with reference to FIG. 5, the first clamping unit 310 clamps both sides of the substrate 20 extending substantially in the vertical direction and the second clamping unit 320 clamps both sides of the substrate 20 extending substantially in the horizontal direction, respectively. In this case, the transverse sides and the longitudinal sides of the clamped substrate 20 may be placed to be mismatched with the alignment reference position CL1 by the first and second clamping units 310 and 320, respectively.

Next, by moving the first and second clamping units 310 and 320 forward or backward in the direction of the first axis AX1 or the second axis AX2 and tilting the substrate 20 in the direction vertical to the imaginary plane VL as the rotation center axis, the first axis alignment (S121) is performed for the transverse side to be parallel to the first axis AX1 and the second axis alignment (S12) is performed for the longitudinal side of the substrate 20 to be parallel to the second axis AX2.

As such, the first and second axis alignments may be simultaneously or concurrently performed by the advance, the reverse, and the tilt in the direction of the first axis AX1 and the second axis AX2 of the first and the second clamping units 310 and 320, and the moving trajectory of the first and the second clamping units 310 and 320 is substantially parallel to the imaginary plane VP.

Figure 6:
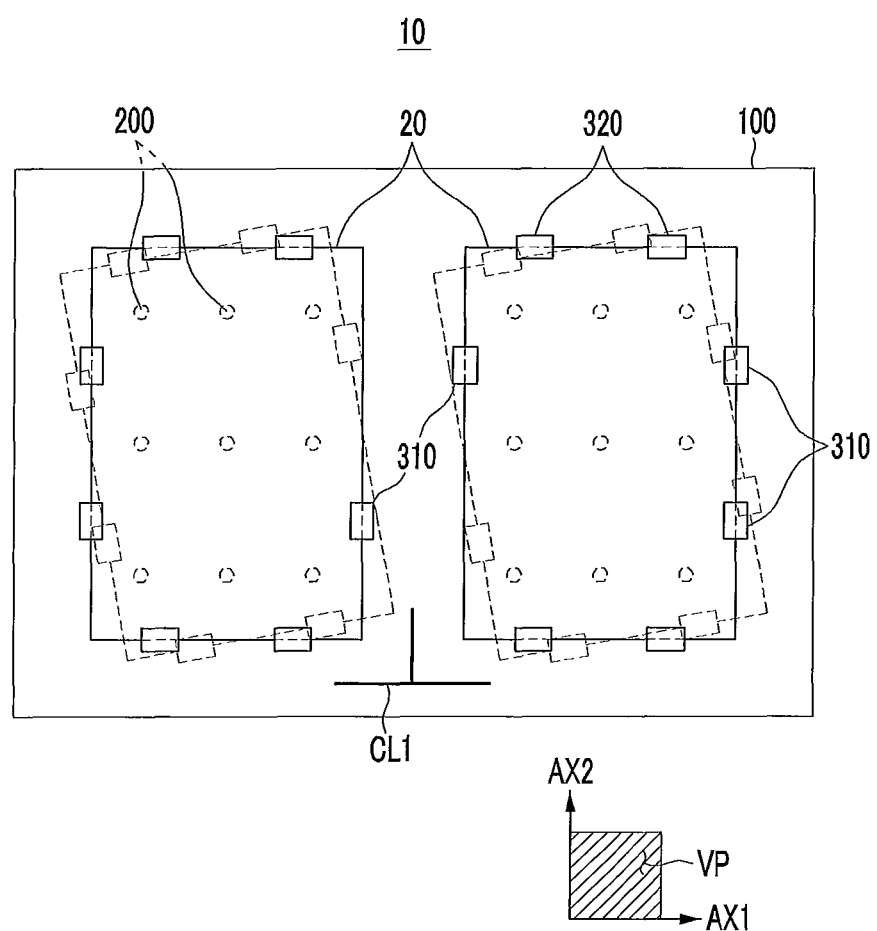
FIG. 6 is a view showing a completed state of an alignment of a substrate in a method for aligning a substrate according to an exemplary embodiment.

FIG. 6 is a view showing a completed state of a substrate in a method for aligning a substrate according to an exemplary embodiment. The positions of the substrate and the supporting unit in FIG. 6 and the first and the second clamping units in FIG. 5 are indicated by dotted lines.

If the first and second axis alignments are completed, as shown in FIG. 6, the transverse sides of the two aligned substrates 20 are placed to be parallel to the first axis AX1 and the longitudinal sides are placed to be parallel to the second axis AX2. In addition, two substrates 20 are placed parallel to the imaginary plane VP.

Figure 7:
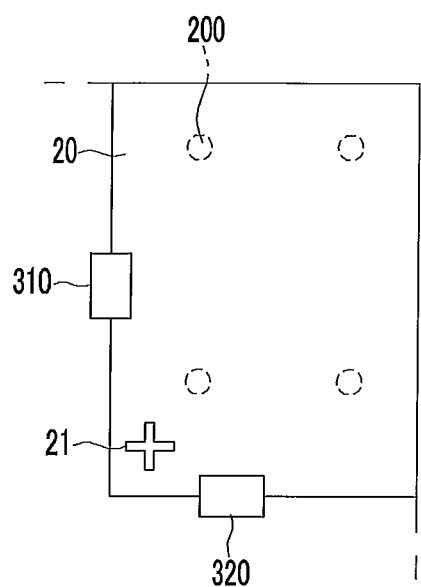
FIG. 7 is an enlarged view of a portion of a substrate in a method for aligning a substrate according to an exemplary embodiment.

FIG. 7 is an enlarged view of a portion of a substrate in a method for aligning a substrate according to an exemplary embodiment.

The alignment test step (S13) tests whether the first and second axis alignments (S121) and (S122) are normally performed through visual alignment.

Next, whether an error is generated between the substrate 20 and the imaginary plane VP in the first and the second axis alignments (S121) and (S122) is tested, and then a fine alignment step (S131) in which the substrate 20 is corrected to be parallel to the imaginary plane VP is performed.

Meanwhile, the alignment test step (S13) includes a step S132 for detecting an alignment mark 21 formed at one side of the substrate 20, as shown in FIG. 7, to confirm whether each substrate 20 is correctly aligned after the first and second axis alignments (S121) and (S122) are completed, as shown in FIG. 6.

Meanwhile, the order of performing the fine alignment (S131) and the alignment mark detection (S132) may be changed with each other when the alignment is not completed through the alignment mark detection step (S132) after the fine alignment step (S131) and the first and second axis alignment steps (S121) and (S122), or the fine alignment step (S131) may be performed again.

As described above, since the method for aligning the substrate according to an exemplary embodiment may simultaneously or concurrently place and align two or more substrates 20, compared to the conventional substrate aligning method (not necessarily prior art) in which only one substrate is placed and aligned, improved productivity due to the reduction of tact time may be obtained.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A substrate aligning apparatus comprising:
a stage having an alignment reference position formed thereon and configured to support a plurality of substrates;
a supporting pin placed in the stage to support the substrates; and
an alignment clamp configured to respectively move each of the substrates to align the substrates,
wherein the alignment clamp is further configured to respectively align at least two of the substrates with reference to the alignment reference position as a two-dimensional coordinate system which includes a first axis and a second axis crossing the first axis and is set on an imaginary plane by the first and second axes,
wherein the alignment clamp includes:
a first clamp configured to clamp first opposing sides of each of the at least two substrates; and
a second clamp configured to clamp second opposing sides of each of the at least two substrates which are perpendicular to the first opposing sides.

2. The substrate aligning apparatus of claim 1, wherein the stage is placed so that an upper surface is substantially parallel to the imaginary plane.

3. The substrate aligning apparatus of claim 1, wherein the supporting pin is configured to respectively support a lower portion of the substrates.

4. The substrate aligning apparatus of claim 3, wherein the supporting pin comprises a plurality of supporting pins that are respectively configured to rise and fall toward the substrates with reference to the stage.

5. The substrate aligning apparatus of claim 1, wherein the alignment clamp is configured to move on the stage to clamp and fix a portion of at least one of the substrates, and wherein a moving trajectory of the substrate by the alignment clamp is substantially parallel to the imaginary plane.

6. The substrate aligning apparatus of claim 5,
wherein the first clamp is configured to axially align the clamped substrates with reference to the first axis and
wherein the second clamp is configured to axially align the clamped substrates with reference to the second axis.

7. The substrate aligning apparatus of claim 1, wherein the alignment clamp is configured to move all of the substrates in a direction parallel to a top surface of the stage.

8. The substrate aligning apparatus of claim 1, wherein the alignment clamp includes a first pair of clamps opposing each other and configured to move one of the substrates in a first direction and a second pair of clamps opposing each other and configured to move another one of the substrates in a second direction crossing the first direction.

9. The substrate aligning apparatus of claim 1, wherein the alignment clamp is further configured to move all of the substrates toward the alignment reference position.

10. A method for aligning a substrate comprising:
mounting a plurality of substrates on a stage having an alignment reference position formed thereon;
clamping first opposing sides of each of at least two of the substrates;
clamping second opposing sides of each of the at least two substrates which are perpendicular to the first opposing sides;
aligning the substrates with reference to the alignment reference position as a two-dimensional coordinate system which includes a first axis and a second axis crossing the first axis and is set on an imaginary plane by the first and second axes; and
testing the alignment of the substrates.

11. The method of claim 10, further comprising, after at least one of the substrates is mounted on a supporting pin installed on the stage, lowering the supporting pin and the substrate toward the upper surface of the stage.

12. The method of claim 10, wherein the aligning includes
first axially aligning the clamped substrates with reference to the first axis; and
second axially aligning the clamped substrates with reference to the second axis.

13. The method of claim 12, wherein the first axially aligning and the second axially aligning are simultaneously or concurrently performed.

14. The method of claim 10, wherein a moving trajectory of the clamped substrates is substantially parallel to the imaginary plane.

15. The method of claim 10, wherein the aligning comprises performing a fine alignment for the clamped substrates to be substantially parallel to the imaginary plane.

16. The method of claim 10, wherein the aligning comprises detecting an alignment mark formed in the clamped substrates.

17. A substrate aligning apparatus comprising:
a stage having an alignment reference position formed thereon and configured to support a plurality of substrates; and
an alignment clamp configured to respectively move each of the substrates to align the substrates, wherein the alignment clamp is configured to respectively align at least two of the substrates with reference to the alignment reference position as a two-dimensional coordinate system which includes a first axis and a second axis crossing the first axis and is set on an imaginary plane by the first and second axes,
wherein the alignment clamp includes:
a first clamp configured to clamp first opposing sides of each of the at least two substrates; and
a second clamp configured to clamp second opposing sides of each of the at least two substrates which are perpendicular to the first opposing sides.

18. The substrate aligning apparatus of claim 17, further comprising a supporting pin placed in the stage to support the substrates.

19. The substrate aligning apparatus of claim 18, wherein the supporting pin is configured to respectively support a lower portion of the substrates.

20. The substrate aligning apparatus of claim 18, wherein the supporting pin comprises a plurality of supporting pins that are respectively configured to rise and fall toward the substrates with reference to the stage.

21. The substrate aligning apparatus of claim 17, wherein the alignment clamp is configured to move on the stage to clamp and fix a portion of at least one of the substrates.

22. The substrate aligning apparatus of claim 21,
wherein the first clamp is configured to axially align the clamped substrates with reference to the first axis and
wherein the second clamp is configured to axially align the clamped substrates with reference to the second axis.

* * * * *